(12) United States Patent
Kamisawa et al.

(10) Patent No.: US 6,485,779 B1
(45) Date of Patent: Nov. 26, 2002

(54) SOLUTION FOR FORMING FERROELECTRIC FILM AND METHOD FOR FORMING FERROELECTRIC FILM

(75) Inventors: Akira Kamisawa, Kyoto (JP); Hayato Katsuragi, Souka (JP); Taku Yamate, Souka (JP); Kiyoto Mori, Souka (JP)

(73) Assignees: Rohm Co., Ltd, Kyoto (JP); Kanto Kagaku Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/576,124

(22) Filed: May 22, 2000

Related U.S. Application Data

(62) Division of application No. 09/135,749, filed on Aug. 18, 1998, now Pat. No. 6,086,665.

(30) Foreign Application Priority Data

Aug. 21, 1997 (JP) .............................................. 9-224701

(51) Int. Cl.$^7$ ................................................. B05D 5/12
(52) U.S. Cl. .................... 427/100; 427/126.3; 29/25.35
(58) Field of Search .............................. 427/100, 126.3; 29/25.35; 106/287.18, 287.19

(56) References Cited

U.S. PATENT DOCUMENTS

| | | | |
|---|---|---|---|
| 4,908,065 A | 3/1990 | Tanitsu et al. | 106/287.24 |
| 5,393,907 A | 2/1995 | Hashimoto et al. | 556/28 |
| 5,753,945 A | 5/1998 | Chivukula et al. | 257/295 |

FOREIGN PATENT DOCUMENTS

EP           0 854 503           7/1998

*Primary Examiner*—Brian K. Talbot
(74) *Attorney, Agent, or Firm*—Arent Fox Kintner Plotkin & Kahn

(57) ABSTRACT

Acetylacetone and an aqueous nitric acid are included in a solution in which organic metal compounds of metals constituting a ferroelectric in an organic solvent thereby forming a ferroelectric film formation solution. The solution is applied to a substrate, followed by drying and baking to obtain a ferroelectric film. As a consequence, even when forming a ferroelectric film such as a PZT or PLZT film containing a II group element in the periodic table, a stable ferroelectric film formation solution which prevents neither crystallization nor gelation and is reduced in a change with time in the viscosity thereof can be obtained. A ferroelectric film which contains a II group element and has excellent ferroelectric properties can be thus produced with ease.

4 Claims, 6 Drawing Sheets

SOLUTION FOR FORMING FERROELECTRIC FILM AND METHOD FOR FORMING FERROELECTRIC FILM

This is a divisional application for U.S. patent application Ser. No. 09/135,749, filed on Aug. 18, 1998, now U.S. Pat. No. 6,086,665, the diclosure of which is hereby incorporated by reference.

BACKGROUND OF THE INVENTION

The present invention relates to a ferroelectric film formation solution for forming a ferroelectric film on a substrate and a method for forming a ferroelectric film using the solution. Particularly, the present invention relates to a ferroelectric film formation solution which has neither crystallization nor gelation when forming a ferroelectric film containing a II group element in the periodic table such as Mg, Ca, Sr, or Ba and which can form a stable ferroelectric film on a substrate such as sapphire, titanium, or platinum. The present invention also relates to a method for forming a ferroelectric film using the ferroelectric forming solution.

Lead zirconate titanate (PZT) which is a complex oxide of Pb, Zr, and Ti and lead lanthanum zirconate titanate (PLZT) which is a complex oxide of Pb, Zr, Ti, and La have high dielectric capability, ferroelectricity, piezoelectric effect, and pyroelectricity. The thin films of these complex oxides are therefore used for semiconductor memories such as a DRAM (memories using paradielectrics with high dielectric constant such as $(Ba,Sr)TiO_3$) and FRAM (memories using ferroelectrics such as PZT), capacitors, sensors, and actuators.

In recent years, ferroelectrics containing a small amount of Nb, Fe, Mn, Al, Sn, Bi, Sb, Ba, Ca, Sr, and the like have been studied to improve the characteristics of PZT or PLZT. These ferroelectrics are reported, for example, in Journal of American Ceramic Society, Vol 77, pages 2620–2624 (1994), Japanese Patent Application Laid-Open (JP-A) No. H1-260870, and the like.

Generally, an organic metal compound such as an alkoxide of a metal which is a component of ferroelectrics is reacted in an organic solvent. Then a chelating agent is added to the mixture to improve the stability of a solution, or the mixture is hydrated. And such a solution is widely used for forming the ferroelectrics.

In such a preparing method, however, a solution for forming a thin film of PZT or PLZT containing a II group element in the periodic table such as Mg, Ca, Sr, or Ba tends to crystallize or gel. Even when these phenomena are not produced, the viscosity of the solution changes with time. If the viscosity of the solution increases, the solution cannot be uniformly applied. Also, in the case where the viscosity of the solution increases or decreases, the film thickness when a film is formed varies, giving rise to the problem that it is very difficult to prepare a solution for forming a stable thin film.

SUMMARY OF THE INVENTION

An object of the present invention is to provide a stable ferroelectric film formation solution which prevents crystallization or gelation even when forming a ferroelectric film such as PZT or PLZT containing a II group element in the periodic table and which is reduced in a change in the viscosity of the solution with time.

Another object of the present invention is to provide a method for forming a ferroelectric film using the ferroelectric film forming solution.

The present inventors have conducted earnest studies to obtain a stable raw material solution, when forming a ferroelectric film by applying the raw material solution of a ferroelectric followed by drying and baking, which is used for forming the aforementioned ferroelectric film of PZT or PLZT or the like containing a II group element in the periodic table and which neither crystallizes nor gels in a solution condition and is reduced in a change with time in the viscosity of the solution. As a result, the present inventors have found that a stable solution for forming a ferroelectric film of PZT or PLZT or the like containing a II group element in the periodic table which solution neither crystallizes nor gels and is reduced in a change with time in the viscosity of the solution can be obtained by adding acetylacetone and an aqueous nitric acid solution to a solution prepared from an organic solvent and an organic metal compound such as an alkoxide of a metal which is a component of PZT or PLZT containing a II group element in the periodic table.

Accordingly, a ferroelectric film formation solution according to the present invention comprises acetylacetone and an aqueous nitric acid solution in a solution prepared from an organic solvent and an organic metal compound of a metal constituting a ferroelectric.

In this case, the solution prepared from an organic solvent and an organic metal compound means a solution comprising an organic metal compound and an organic solvent, for example the solution in which an organic metal compound is dissolved in an organic solvent or a reacted product is dissolved in an organic solvent, which reacted product is produced by an alcohol exchange reaction (a reaction between an organic metal compound and an organic solvent), a complex alkoxide formation reaction (a reaction between an alcohol exchange reaction product and the organic metal compound and a reaction between organic metal compounds), or coordination of the organic solvent to a metal atom.

Particularly when the aforementioned organic metal compound contains an organic metal compound of a II group element in the periodic table, crystallization or gelation tends to be caused. In the present invention in which acetylacetone and an aqueous nitric acid solution is added to the ferroelectric film forming solution, however, crystallization or gelation can be prevented, which is particularly preferable.

As the II group element, at least one element selected from the group consisting of Mg, Ca, Sr, and Ba may be used.

It is particularly preferable when the aforementioned organic metal compound comprise organic metal compounds respectively containing titanium, zirconium, lanthanum, and lead constituting lead zirconate titanate (PZT) or lead lanthanum zirconate titanate (PLZT), and further an organic metal compound of a II group element in the periodic table to prevent crystallization or gelation which is easily caused in these organic metal compound.

A method for forming the ferroelectric film of the present invention comprises (a) a step of preparing a solution containing an organic solvent and an organic metal compound of a metal constituting a ferroelectric and mixing acetylacetone and an aqueous nitric acid solution with the above solution to prepare a ferroelectric film formation solution, (b) a step of applying the ferroelectric film formation solution to the surface of a substrate, and (c) a step of baking the applied solution after it is dried.

It is particularly preferable when an organic metal compound of a II group element in the periodic table is contained in the above solution to form a ferroelectric film containing the II group element in the periodic table, because crystallization or gelation is not caused and a stable ferroelectric film containing the II group element in the periodic table can be formed.

When organic metal compounds respectively containing titanium, zirconium, and lead which constitute lead zirconate titanate (PZT) are used and further an organic metal compound of a II group element in the periodic table is added, there is obtained a PZT thin film to which the II group element is added.

When organic metal compounds respectively containing titanium, zirconium, lanthanum, and lead which constitute lead lanthanum zirconate titanate (PLZT) are used and further an organic metal compound of a II group element in the periodic table is added, there is obtained a PLZT thin film to which the II group element is added.

DETAILED DESCRIPTION

Figure 1:
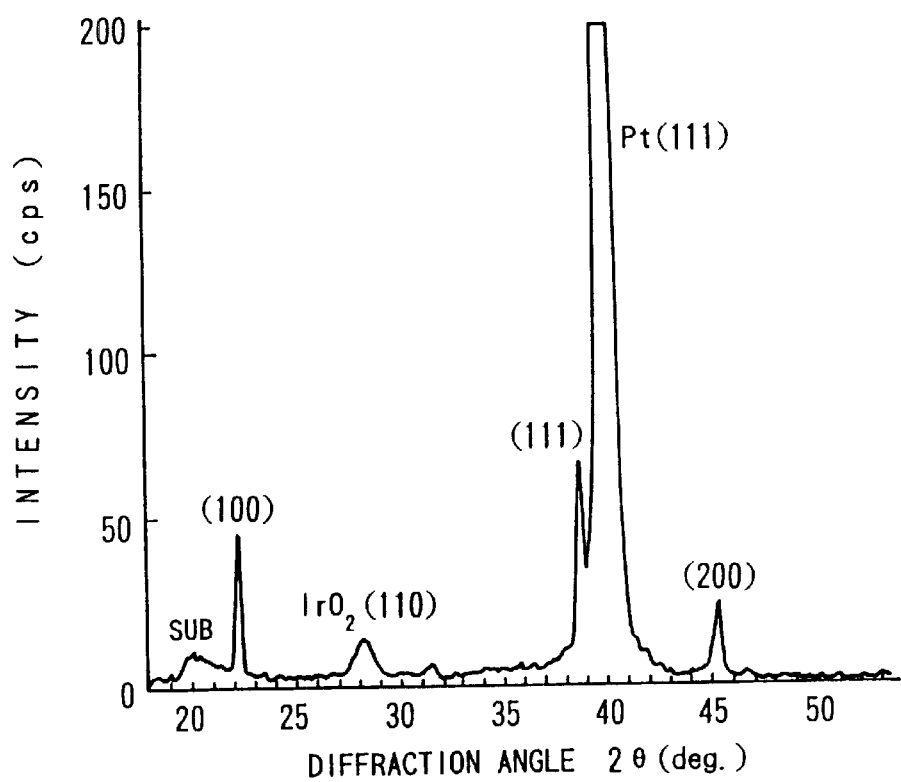
FIG. 1 is a view of a X-ray diffraction pattern of a PLZT film containing Ca and Sr in Example 1.

In a ferroelectric film formation solution according to the present invention, acetylacetone and an aqueous nitric acid solution are allowed to be contained in a solution prepared from an organic solvent and an organic compound of a metal constituting a ferroelectric.

Examples of the ferroelectric include perovskite-types such as $BaTiO_3$, $PbTiO_3$, $SrTiO_3$, lead zirconate titanate (PZT), and lead lanthanum zirconate titanate(PLZT); pseudo ilmenite-types such as $LiNbO_3$ and $LiTaO_3$; tungsten bronze-types such as $(Sr,Ba)Nb_2O_6$; and bismuth layer structures such as $Bi_4Ti_3O_{12}$. Among these, PZT and PLZT are frequently used for semiconductor memories or capacitors because these compounds have excellent crystallinity and ferroelectricity or high dielectricity. As aforementioned, such a compound in which a II group element in the periodic table such as Ca, Sr, Mg, Ba, or the like or two or more of these elements are added to the ferroelectric is used. As the organic metal compound of a metal constituting PZT or PLZT, the following compounds are used:

First, examples of lead compounds include lead alkoxides such as lead dimethoxide, lead diethoxide, and lead dibutoxide; and lead acetate trihydrate, lead acetate anhydride, lead 2-ethylhexanoate, lead n-octanate, and lead naphthenate, etc. Among these, lead acetate trihydrate and lead acetate anhydride are preferable because these compounds are inexpensive and easily available.

Examples of zirconium compounds include zirconium alkoxides such as zirconium tetramethoxide, zirconium tetraethoxide, zirconium tetrapropoxide, and zirconium tetrabutoxide; and zirconium n-octanate, and zirconium naphthenate, etc. Among these, zirconium tetrapropoxide and zirconium tetrabutoxide are preferable because of easy availability.

Examples of titanium compounds include titanium alkoxides such as titanium tetramethoxide, titanium tetraethoxide, titanium tetrapropoxide, and titanium tetrabutoxide. Among these, titanium tetrapropoxide and titanium tetrabutoxide are preferable because these compounds are inexpensive and easily available.

Examples of lanthanum compounds include lanthanum alkoxides such as lanthanum trimethoxide, lanthanum triethoxide, lanthanum tripropoxide, and lanthanum tributoxide; and lanthanum acetate 1.5 hydrate, and lanthanum acetate anhydride, etc. Among these compounds, lanthanum tripropoxide, lanthanum tributoxide, and lanthanum acetate 1.5 hydrate are preferable because of easy availability.

Examples of calcium compounds include calcium alkoxides such as calcium dimethoxide, calcium diethoxide, calcium dipropoxide, and calcium dibutoxide; and calcium acetate one hydrate, calcium acetate anhydride, calcium 2-ethylhexanoate, calcium n-octanate, and calcium naphthenate, etc. Among these, calcium dipropoxide, calcium dibutoxide, and calcium acetate one hydrate are preferable because these compounds are inexpensive and easily available.

Examples of strontium compounds include strontium alkoxides such as strontium dimethoxide, strontium diethoxide, strontium dipropoxide, and strontium dibutoxide; and strontium acetate 0.5 hydrate, and strontium acetate anhydride, strontium 2-ethylhexanoate, strontium n-octanate, and strontium naphthenate, etc. Among these compounds, strontium dipropoxide, strontium dibutoxide, and strontium acetate 0.5 hydrate are preferable because of easy availability.

Examples of magnesium compounds include magnesium alkoxides such as magnesium dimethoxide, magnesium diethoxide, magnesium dipropoxide, and magnesium dibutoxide. Among these compounds, magnesium dipropoxide and magnesium dibutoxide are preferable because of easy availability.

Examples of barium compounds include barium alkoxides such as barium dimethoxide, barium diethoxide, barium dipropoxide, and barium dibutoxide; and barium acetate. Among these compounds, barium dipropoxide, barium dibutoxide, and barium acetate are preferable because of easy availability.

Given as examples of the above organic solvent are methyl alcohol, ethyl alcohol, isopropyl alcohol, n-propyl alcohol, n-butyl alcohol, ethylene glycol, propylene glycol, butylene glycol, hexylene glycol, diethylene glycol, dipropylene glycol, dihexylene glycol, 2-methoxyethanol, 2-ethoxyethanol, 2-butoxyethanol, 2-propoxyethanol, 1-methoxy-2-propanol, 1-ethoxy-2-propanol, 1-butoxy-2-propanol, 1,2-dimethoxyethane, 1,2-diethoxyethane, 1,2-dipropxyethane, 1,2-dibutoxyethane, 2-(2-methoxyethoxy)

ethanol, 2-(2-ethoxyethoxy)ethanol, 2-(2-butoxyethoxy) ethanol, 1-butoxyethoxypropanol, 1-(2-methoxypropoxy)-2-propanol, and 1-(2-ethoxypropoxy)-2-propanol, etc. These organic solvents may be used either singly or in combinations of two or more.

Next, a method for producing a ferroelectric film formation solution of the present invention will be explained. First, it is desirable that an organic metal compound such as a metal alkoxide which is a component of the above ferroelectric be reacted in the above organic solvent to synthesize a complex alkoxide solution, to which were added acetylacetone and an aqueous nitric acid solution to carry out a hydrolysis reaction thereby producing a ferroelectric film. In this case, there are no limitations to the order of additions of acetyl acetone and the aqueous nitric acid solution. Though this ferroelectric film formation solution may be used as it is, additives including amines such as monoethanolamine, diethanolamine, and triethanolamine which act as a chelating agent; a stabilizer such as β-diketones such as benzoylacetone and dibenzoylacetone except for acetylacetone; and glycols such as ethylene glycol, diethylene glycol, triethylene glycol, polyethylene glycol, and propylene glycol for improving application characteristics may be added to the solution. When the ferroelectric material is doped with Fe, Nb, Mn, Al, Cd, Y, or the like according to requirements for the ferroelectric film, organic metal compounds of these elements may be added to the solution.

For example, iron alkoxides such as iron trimethoxide, iron triethoxide, iron tripropoxide, and iron tributoxide as the organic metal compounds of Fe; niobium alkoxides such as niobium pentamethoxide, niobium pentaethoxide, niobium pentapropoxide, and niobium pentabutoxide as the organic metal compounds of Nb; manganese alkoxides such as manganese dimethoxide, manganese diethoxide, manganese dipropoxide, and manganese dibutoxide; and manganese acetate as the organic metal compounds of Mn; aluminum alkoxides such as aluminum trimethoxide, aluminum triethoxide, aluminum tripropoxide, and aluminum tributoxide as the organic metal compounds of Al; cadmium alkoxides such as cadmium dimethoxide, cadmium diethoxide, cadmium dipropoxide, and cadmium dibutoxide; and cadmium acetate as the organic metal compounds of Cd; and yttrium alkoxides such as yttrium trimethoxide, yttrium triethoxide, yttrium tripropoxide, and yttrium tributoxide; and yttrium acetate as the organic metal compounds of Y may be respectively used.

The proportion by mol of the above acetylacetone is 0.1 or more and preferably from 0.25 to 2 for PZT or PLZT (for the sum of raw materials of zirconium and titanium, the same rule applies correspondingly to the following). If the proportion is too small, gelation tends to be caused whereas if the proportion is too large, crystallization tends to be caused. Because, in any one of the both cases, no solution with high storage stability can be obtained, the proportion is defined in the above range. As for the aqueous nitric acid solution, of importance is the ratio of amounts of nitric acid and water. The proportion by mol of nitric acid is 3 or less and preferably from 0.2 to 2.5 for PZT or PLZT. This is because gelation or crystallization tends to be caused if the proportion of nitric acid is too small and a change with time in the viscosity of the solution tends to be large whereby a solution with high storage stability can be obtained with difficulty if the proportion is too large. The proportion by mol of water is from 0.5 to 17 and preferably from 1 to 5 for PZT or PLZT. This is because a too small proportion of water tends to cause crystallization and a too large proportion tends to cause gelation whereby a solution with high storage stability can be obtained with difficulty.

Next, a method for forming a film of PZT or PLZT on a substrate of sapphire, titanium, platinum, or the like using the above solution will be explained. First, the solution is applied to the substrate using an application method such as a spin coating method and dipping method. The substrate is then dried, followed by intermediate baking and main baking. These drying and baking are performed by hot plate heating, hot air heating using an oven or a diffusion furnace, infrared heating, or rapid heating (RTA method). The heating temperature in the drying process is 100° C. or more and preferably 120° C. or more with the upper limit being about 200° C. The heating temperatures in the intermediate and main baking steps are about 300 to 500° C. and about 550 to 700° C. respectively. Optimum temperatures in these conditions differ depending on the sorts of substrate and the baking apparatuses to be used. The optimum temperatures are appropriately selected based on these conditions.

The ferroelectric film formation solution of the present invention will be explained in more detail by way of examples together with comparative examples with reference to X-ray diffraction patterns obtained using the solution, which are not intended to be limiting of the present invention.

EXAMPLE 1

0.214 mol of lead acetate trihydrate, 0.006 mol of lanthanum acetate 1.5 hydrate, 0.01 mol of calcium acetate one hydrate, and 0.004 mol of strontium acetate 0.5 hydrate were added to 600 g of 2-methoxyethanol and the mixture was refluxed under heat. The refluxed mixture was concentrated and cooled to room temperature to prepare a suspension (A1). While, 0.08 mol of zirconium tetra-n-propoxide and 0.12 mol of titanium tetraisopropoxide were added to 340 g of 2-methoxyethanol and the mixture was refluxed under heat, then concentrated, and cooled to room temperature to prepare a solution (B1). After that, the suspension (A1) was mixed with the solution (B1) and the mixture was reacted while it was refluxed. The reaction mixture was concentrated and then cooled to room temperature. To the cooled mixture was added a solution consisting of 20 g of acetylacetone, 6.3 g of nitric acid, 5.4 g of water, and 30 g of 2-methoxyethanol. After the resulting mixture was subjected to a hydrolysis reaction at room temperature, the reaction mixture was diluted by 2-methoxyethanol, which was filtered using a 0.22 μm filter to prepare a solution for forming a PLZT film which solution contains Ca and Sr. The concentration of solution is 10% by weight converted into PLZT.

Even after 30 days passed, neither crystallization nor gelation with time were observed and almost no change in the viscosity of the solution with time was observed. It was hence confirmed that the solution had excellent storage stability.

Next, this solution was applied by spin coating to the surface of a Pt/IrO$_2$/SiO$_2$/Si substrate, which was then dried at 150° C. in a clean oven for 30 minutes and then subjected to intermediate baking, which was carried out at 450° C. for 60 minutes in a diffusion furnace. This was followed by spin coating, drying, and intermediate baking. The resulting substrate was then subjected to main baking, which was performed at 650° C. in an oxygen atmosphere for 60 minutes in a diffusion furnace, to form a PLZT film with a thickness of 1,480 angstroms, which film contained Ca and Sr. This film was subjected to an X-ray diffraction analysis and as a result an X-ray diffraction pattern shown in FIG. 1 was obtained. It was confirmed that the film had a perovskite structure which was peculiar to the ferroelectrics. In FIG. 1, incidentally, the axis of abscissa shows a diffraction angle 2θ and the axis of ordinate shows its intensity in which the position with large strength indicates (100), (111), and (200) planes and SUB shows substrate. The same rule applies correspondingly to the figures of the following examples.

Comparative Example 1

A suspension (A1) and a solution (B1) were prepared in the same manner as in Example 1. The suspension (A1) and the solution (B1) were mixed and the mixture was reacted while it was refluxed. The reaction mixture was concentrated and then cooled to room temperature. To the cooled mixture was added a solution consisting of 20 g of acetylacetone, 3.6 g of water, and 30 g of 2-methoxyethanol to prepare a solution for forming a PLZT film in the same manner as in Example 1 which solution contains Ca and Sr. The concentration of solution is 10% by weight converted into PLZT. In this solution, a crystal was precipitated in 14 days after the preparation of the solution. Specifically, since no nitric acid was added to the solution, the solution had poor storage stability and was hence unpractical.

Comparative Example 2

A suspension (A1) and a solution (B1) were prepared in the same manner as in Example 1. The suspension (A1) and the solution (B1) were mixed and the mixture was reacted while it was refluxed. The reaction mixture was concentrated and then cooled to room temperature. To the cooled mixture was added a solution consisting of 6.3 g of nitric acid, 3.6 g of water, and 30 g of 2-methoxyethanol to prepare a solution for forming a PLZT film in the same manner as in Example 1 which solution contains Ca and Sr. The concentration of solution is 10% by weight converted into PLZT. The viscosity of the solution increased 1.2-fold in 21 days after the preparation of the solution, showing that a change in the viscosity of the solution was large and the storage stability was hence poor. Specifically, since no acetylacetone was added to the solution, the solution had poor storage stability and was hence unpractical.

Comparative Example 3

A suspension (A1) and a solution (B1) were prepared in the same manner as in Example 1. The suspension (A1) and the solution (B1) were mixed and the mixture was reacted while it was refluxed. The reaction mixture was concentrated and then cooled to room temperature. To the cooled mixture was added a solution consisting of 3.5 g of diethanolamine, 5.4 g of water, and 30 g of 2-methoxyethanol to prepare a solution for forming a PLZT film in the same manner as in Example 1 which solution contains Ca and Sr. The concentration of solution is 10% by weight converted into PLZT. The solution was gelled in 14 days after the preparation of the solution. Specifically, though diethanolamine acted as a stabilizer for the solution, the solution had poor storage stability and was hence unpractical because neither acetylacetone nor nitric acid was added to the solution.

Comparative Example 4

A suspension (A1) and a solution (B1) were prepared in the same manner as in Example 1. The suspension (A1) and the solution (B1) were mixed and the mixture was reacted while it was refluxed. The reaction mixture was concentrated and then cooled to room temperature. To the cooled mixture was added a solution consisting of 4 g of acetic acid, 5.4 g of water, and 30 g of 2-methoxyethanol to prepare a solution for forming a PLZT film in the same manner as in Example 1 which solution contains Ca and Sr. The concentration of solution is 10% by weight converted into PLZT. The solution was gelled instantly after the preparation of the solution so that no application solution was obtained. Specifically, though acetic acid serves to restrain hydrolysis and acts as a stabilizer for the solution, no action of acetic acid as the stabilizer was observed in this solution and no application solution was produced.

EXAMPLE 2

0.214 mol of lead acetate trihydrate and 0.006 mol of lanthanum acetate 1.5 hydrate were added to 500 g of 2-methoxyethanol and the mixture was refluxed under heat. The refluxed mixture was concentrated and cooled to room temperature to prepare a suspension (A2). While, 0.01 mol of calcium diisopropoxide, 0.004 mol of strontium diisopropoxide, 0.08 mol of zirconium tetra-n-propoxide, and 0.12 mol of titanium tetraisopropoxide were added to 440 g of 2-methoxyethanol. The mixture was refluxed under heat, then concentrated, and cooled to room temperature to prepare a solution (B2). After that, the suspension (A2) was mixed with the solution (B2) and the mixture was reacted while it was refluxed. The reaction mixture was concentrated and then cooled to room temperature. To the cooled mixture was added a solution consisting of 20 g of acetylacetone, 12.6 g of nitric acid, 7.2 g of water, and 30 g of 2-methoxyethanol. After the resulting mixture was subjected to a hydrolysis reaction at room temperature, the reaction mixture was diluted by 2-methoxyethanol, which was filtered using a 0.22 μm filter to prepare a solution for forming a PLZT film which solution contains Ca and Sr. The concentration of solution is 10% by weight converted into PLZT. In this example, organic metal compounds of ca and Sr which were additives were contained in the solution (B1) to prepare the solution.

Even after 30 days passed, neither crystallization nor gelation with time was observed and almost no change with time in the viscosity of the solution was observed. It was hence confirmed that the solution had excellent storage stability.

Figure 2:
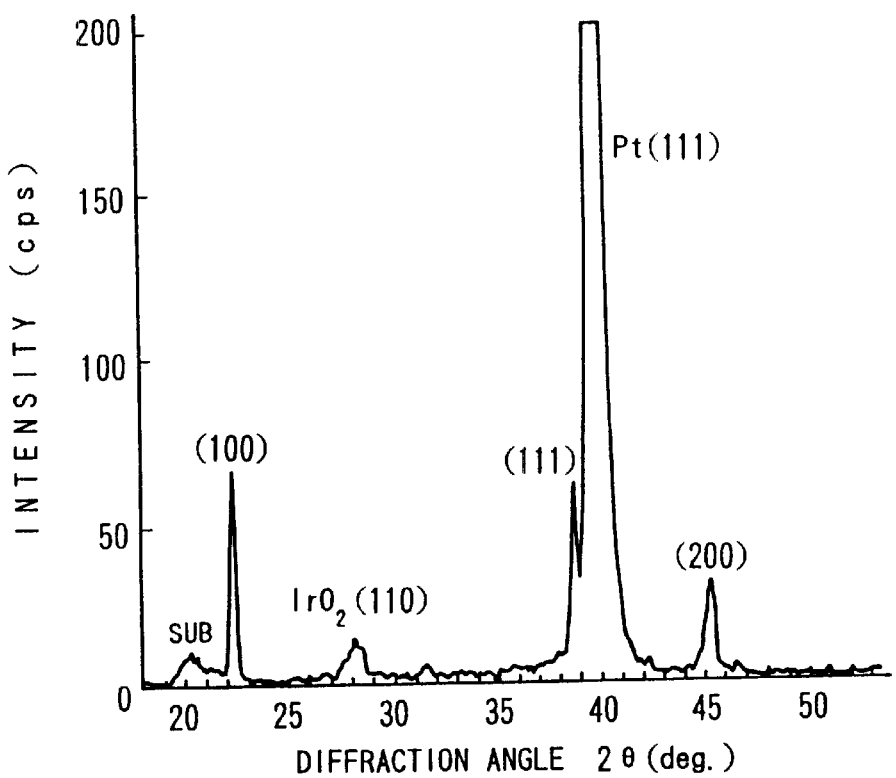
FIG. 2 is a view of a X-ray diffraction pattern of a PLZT film containing Ca and Sr in Example 2.

Next, this solution was applied in the same manner as in Example 1 by spin coating to the surface of a Pt/IrO$_2$/SiO$_2$/Si substrate, which was then baked to form a PLZT film with a thickness of 1,460 angstroms, which film contained Ca and Sr. This film was subjected to an X-ray diffraction analysis and as a result an X-ray diffraction pattern shown in FIG. 2 was obtained. It was confirmed that the film had a perovskite structure which was peculiar to the ferroelectrics.

EXAMPLE 3

0.214 mol of lead acetate trihydrate, 0.01 mol of calcium acetate one hydrate, and 0.004 mol of strontium acetate 0.5 hydrate were added to 600 g of 220 methoxyethanol and the mixture was refluxed under heat. The refluxed mixture was concentrated and cooled to room temperature to prepare a suspension (A3). While, 0.08 mol of zirconium tetra-n-propoxide and 0.12 mol of titanium tetraisopropoxide were added to 340 g of 2-methoxyethanol. The mixture was refluxed under heat, then concentrated, and cooled to room temperature to prepare a solution (B1). After that, the suspension (A3) was mixed with the solution (B1) and the mixture was reacted while it was refluxed. The reaction mixture was concentrated and then cooled to room temperature. To the cooled mixture was added a solution consisting of 20 g of acetylacetone, 6.3 g of nitric acid, 5.4 g of water, and 30 g of 2-methoxyethanol. After the resulting mixture was subjected to a hydrolysis reaction at room temperature, the reaction mixture was diluted by 2-methoxyethanol, which was filtered using a 0.22 μm filter to prepare a solution for forming a PZT film which solution contains Ca and Sr. The concentration of solution is 10% by weight converted into PZT.

Even after 30 days passed, neither crystallization nor gelation with time was observed and almost no change with time in the viscosity of the solution was observed. It was hence confirmed that the solution had excellent storage stability.

Figure 3:
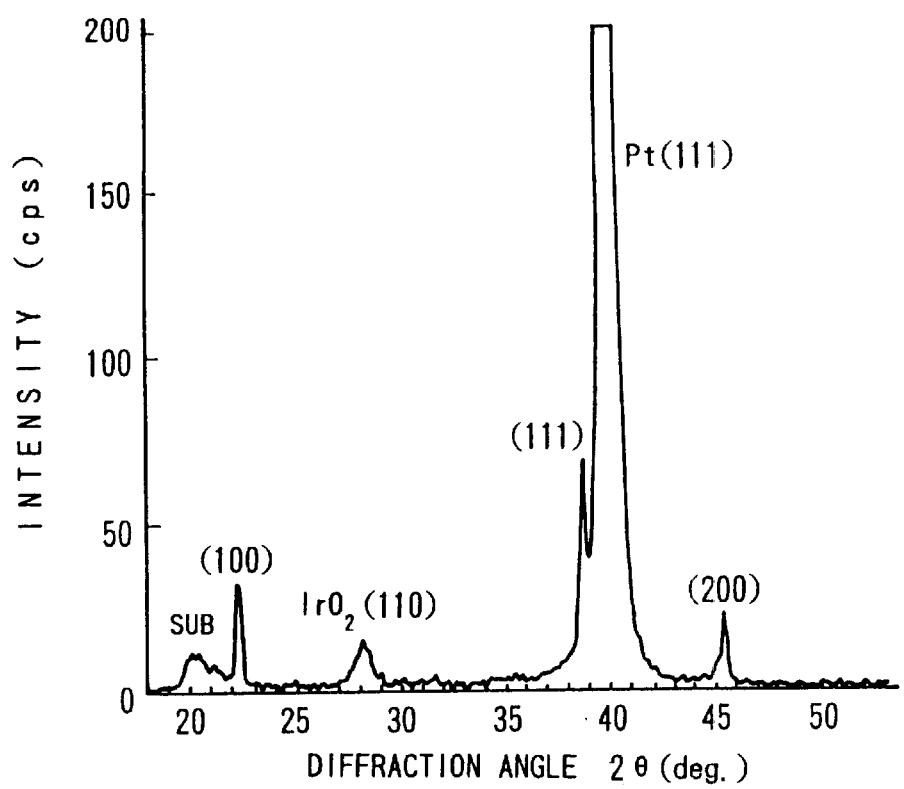
FIG. 3 is a view of a X-ray diffraction pattern of a PZT film containing Ca and Sr in Example 3.

Next, this solution was applied in the same manner as in Example 1 by spin coating to the surface of a $Pt/IrO_2/SiO_2/Si$ substrate, which was then baked to form a PZT film with a thickness of 1,360 angstroms, which film contained Ca and Sr. This film was subjected to an X-ray diffraction analysis and as a result an X-ray diffraction pattern shown in FIG. 3 was obtained. It was confirmed that the film had a perovskite structure which was peculiar to the ferroelectrics.

EXAMPLE 4

0.214 mol of lead acetate trihydrate was added to 500 g of 2-methoxyethanol and the mixture was refluxed under heat. The refluxed mixture was concentrated and cooled to room temperature to prepare a solution (A4). While, 0.01 mol of calcium diisopropoxide, 0.004 mol of strontium diisopropoxide, 0.08 mol of zirconium tetra-n-propoxide, and 0.12 mol of titanium tetraisopropoxide were added to 440 g of 2-methoxyethanol. The mixture was refluxed under heat, then concentrated, and cooled to room temperature to prepare a solution (B2). After that, the solution (A4) was mixed with the solution (B2) and the mixture was reacted while it was refluxed. The reaction mixture was concentrated and then cooled to room temperature. To the cooled mixture was added a solution consisting of 20 g of acetylacetone, 12.6 g of nitric acid, 5.4 g of water, and 30 g of 2-methoxyethanol. After the resulting mixture was subjected to a hydrolysis reaction at room temperature, the reaction mixture was diluted by 2-methoxyethanol, which was filtered using a 0.22 μm filter to prepare a solution for forming a PZT film which solution contains Ca and Sr. The concentration of solution is 10% by weight converted into PZT.

Even after 30 days passed, neither crystallization nor gelation with time was observed and almost no change with time in the viscosity of the solution was observed. It was hence confirmed that the solution had excellent storage stability.

Figure 4:
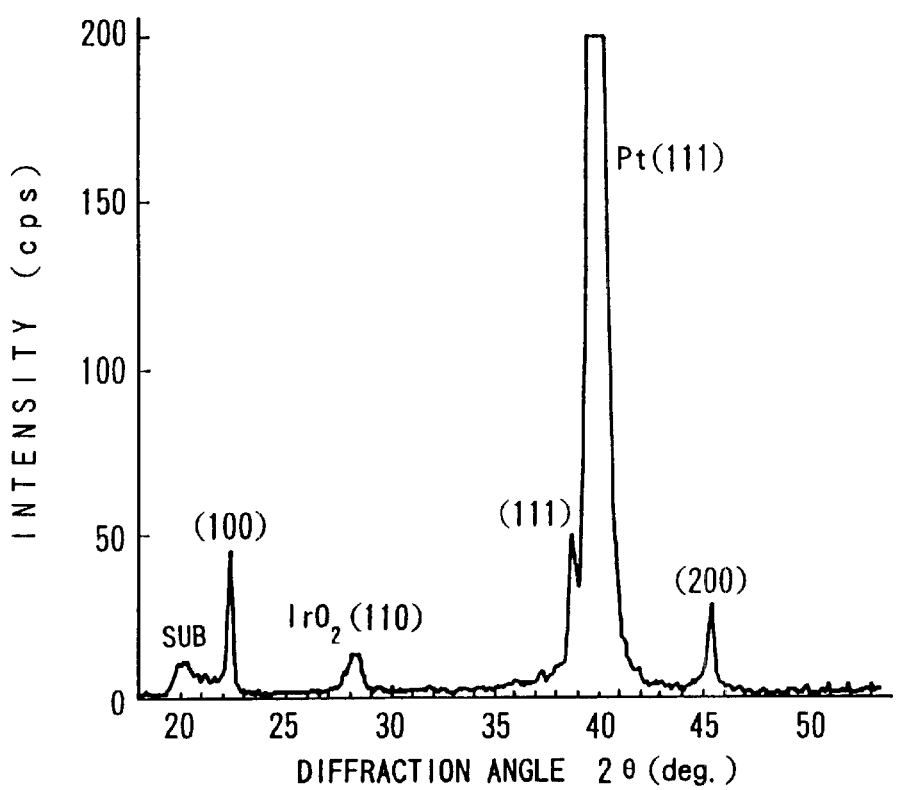
FIG. 4 is a view of a X-ray diffraction pattern of a PZT film containing Ca and Sr in Example 4.

Next, this solution was applied in the same manner as in Example 1 by spin coating to the surface of a $Pt/IrO_2/SiO_2/Si$ substrate, which was then baked to form a PZT film with a thickness of 1,420 angstroms, which film contained Ca and Sr. This film was subjected to an X-ray diffraction analysis and as a result an X-ray diffraction pattern shown in FIG. 4 was obtained. It was confirmed that the film had a perovskite structure which was peculiar to the ferroelectrics.

Comparative Example 5

A solution (A4) and a solution (B2) were prepared in the same manner as in Example 4. The solution solution (A4) and the solution (B2) were mixed and the mixture was reacted while it was refluxed. The reaction mixture was concentrated and then cooled to room temperature. To the cooled mixture was added a solution consisting of 20 g of acetylacetone, 5.4 g of water, and 30 g of 2-methoxyethanol to prepare a solution for forming a PZT film in the same manner as in Example 4 which solution contains Ca and Sr. The concenration of solution is 10% by weight converted into PZT. The solution was crystallized in 14 days after the preparation of the solution. Specifically, the solution had poor storage stability and was hence unpractical because no nitric acid was added to the solution.

EXAMPLE 5

0.214 mol of lead acetate trihydrate, 0.002 mol of lanthanum acetate 1.5 hydrate, and 0.02 mol of calcium acetate one hydrate were added to 600 g of 2-methoxyethanol and the mixture was refluxed under heat. The refluxed mixture was concentrated and cooled to room temperature to prepare a suspension (A5). While, 0.08 mol of zirconium tetra-n-propoxide and 0.12 mol of titanium tetraisopropoxide were added to 340 g of 2-methoxyethanol and the mixture was refluxed under heat, then concentrated, and cooled to room temperature to prepare a solution (B1). After that, the suspension (A5) was mixed with the solution (B1) and the mixture was reacted while it was refluxed. The reaction mixture was concentrated and then cooled to room temperature. To the cooled mixture was added a solution consisting of 20 g of acetylacetone, 6.3 g of nitric acid, 5.4 g of water, and 30 g of 2-methoxyethanol. After the resulting mixture was subjected to a hydrolysis reaction at room temperature, the reaction mixture was diluted by 2-methoxyethanol, which was filtered using a 0.22 μm filter to prepare a solution for forming a PLZT film which solution contains Ca. The concentration of solution is 10% by weight converted into PLZT. Specifically, the same procedures as in Example 1 were carried out except that strontium acetate which was an organic metal compound of Sr contained in the suspension (A1) of Example 1 was not added and the amounts of lanthanum acetate and calcium acetate were altered.

In the same manner as in Example 1, even after 30 days passed, neither crystallization nor gelation with time was observed and almost no change in the viscosity of the solution with time was observed. It was hence confirmed that the solution had excellent storage stability.

Figure 5:
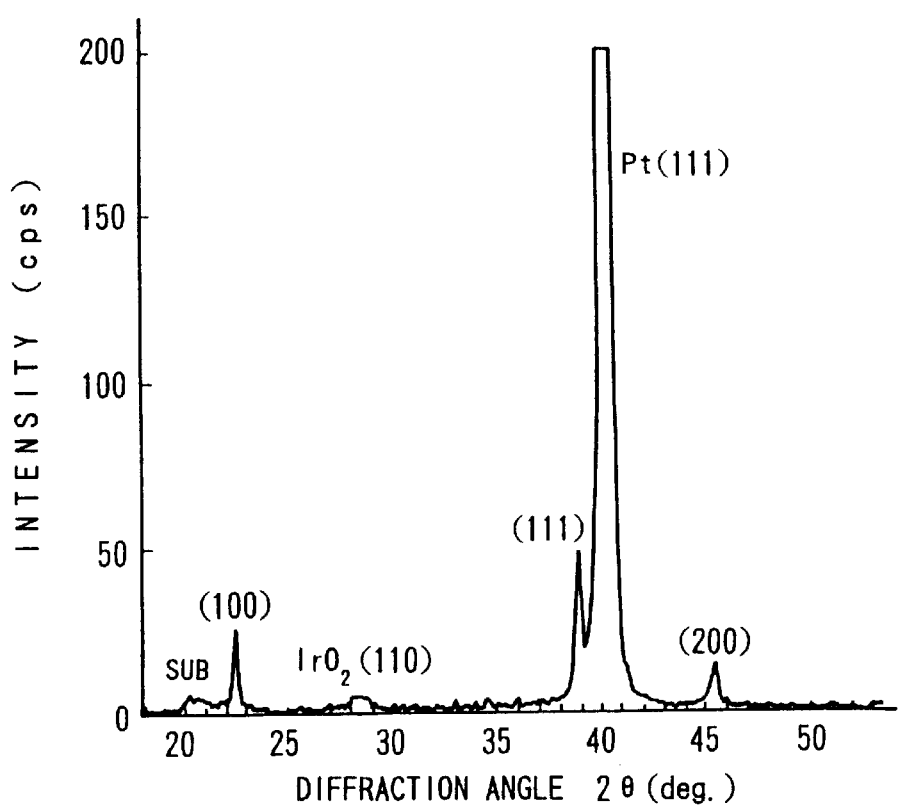
FIG. 5 is a view of a X-ray diffraction pattern of a PLZT film containing Ca in Example 5.

Next, this solution was applied in the same manner as in Example 1 by spin coating to the surface of a $Pt/IrO_2/SiO_2/Si$ substrate, which was then baked to form a PLZT film with a thickness of 1,180 angstroms, which film contained Ca. This film was subjected to an X-ray diffraction analysis and as a result an X-ray diffraction pattern shown in FIG. 5 was obtained. It was confirmed that the film had a perovskite structure which was peculiar to the ferroelectrics.

EXAMPLE 6

0.214 mol of lead acetate trihydrate, 0.002 mol of lanthanum acetate 1.5 hydrate, and 0.002 mol of strontium acetate 0.5 hydrate were added to 600 g of 2-methoxyethanol and the mixture was refluxed under heat. The refluxed mixture was concentrated and cooled to room temperature to prepare a suspension (A6). While, 0.08 mol of zirconium tetra-n-propoxide and 0.12 mol of titanium tetraisopropoxide were added to 340 g of 2-methoxyethanol and the mixture was refluxed under heat, then concentrated, and cooled to room temperature to prepare a solution (B1). After that, the suspension (A6) was mixed with the solution (B1) and the mixture was reacted while it was refluxed. The reaction mixture was concentrated and then cooled to room temperature. To the cooled mixture was added a solution consisting of 20 g of acetylacetone, 6.3 g of nitric acid, 5.4 g of water, and 30 g of 2-methoxyethanol. After the resulting mixture was subjected to a hydrolysis reaction at room temperature, the reaction mixture was diluted by 2-methoxyethanol, which was filtered using a 0.22 μm filter to prepare a solution for forming a PLZT film which solution contains Sr. The concentration of solution is 10% by weight converted into PLZT. Specifically, the same procedures as in Example 1 were carried out except that calcium acetate which was an organic metal compound of Ca contained in the suspension (A1) of Example 1 was not added and the amounts of lanthanum acetate and strontium acetate were altered.

In the same manner as in Example 1, even after 30 days passed, neither crystallization nor gelation with time was observed and almost no change in the viscosity of the solution with time was observed. It was hence confirmed that the solution had excellent storage stability.

Figure 6:
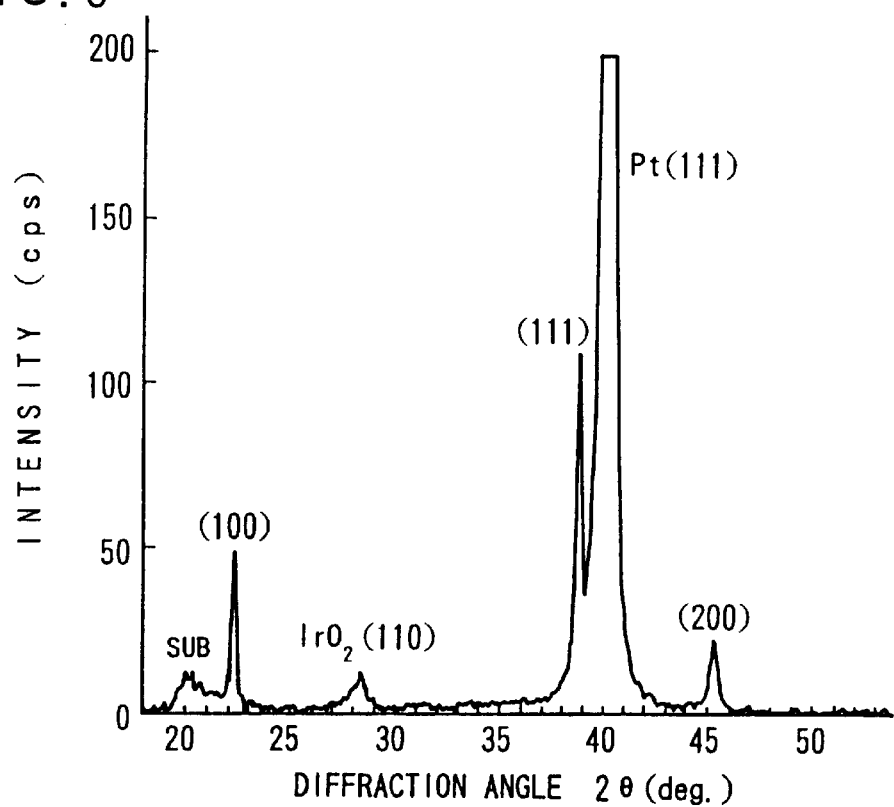
FIG. 6 is a view of a X-ray diffraction pattern of a PLZT film containing Sr in Example 6.

Next, this solution was applied in the same manner as in Example 1 by spin coating to the surface of a Pt/IrO$_2$/SiO$_2$/Si substrate, which was then baked to form a PLZT film with a thickness of 1,260 angstroms, which film contained Sr. This film was subjected to an X-ray diffraction analysis and as a result an X-ray diffraction pattern shown in FIG. 6 was obtained. It was confirmed that the film had a perovskite structure which was peculiar to the ferroelectrics.

EXAMPLE 7

0.214 mol of lead acetate trihydrate was added to 600 g of 2-methoxyethanol and the mixture was refluxed under heat. The refluxed mixture was concentrated and cooled to room temperature to prepare a solution (A7). While, 0.08 mol of zirconium tetra-n-propoxide, 0.12 mol of titanium tetraisopropoxide, and 0.01 mol of calcium diisopropoxide were added to 340 g of 2-methoxyethanol and the mixture was refluxed under heat, then concentrated, and cooled to room temperature to prepare a solution (B3). After that, the solution (A7) was mixed with the solution (B3) and the mixture was reacted while it was refluxed. The reaction mixture was concentrated and then cooled to room temperature. To the cooled mixture was added a solution consisting of 20 g of acetylacetone, 12.6 g of nitric acid, 5.4 g of water, and 30 g of 2-methoxyethanol. After the resulting mixture was subjected to a hydrolysis reaction at room temperature, the reaction mixture was diluted by 2-methoxyethanol, which was filtered using a 0.22 μm filter to prepare a solution for forming a PZT film which solution contains Ca. The concentration of solution is 10% by weight converted into PZT. Specifically, the same procedures as in Example 4 were carried out except that the amounts of 2-methoxyethanol in the solution (A4) and the solution (B2) in Example 4 were altered and strontium diisopropoxide which was an organic metal compound of Sr in the solution (B2) was not added.

In the same manner as in Example 4, even after 30 days passed, neither crystallization nor gelation with time was observed and almost no change in the viscosity of the solution with time was observed. It was hence confirmed that the solution had excellent storage stability.

Figure 7:
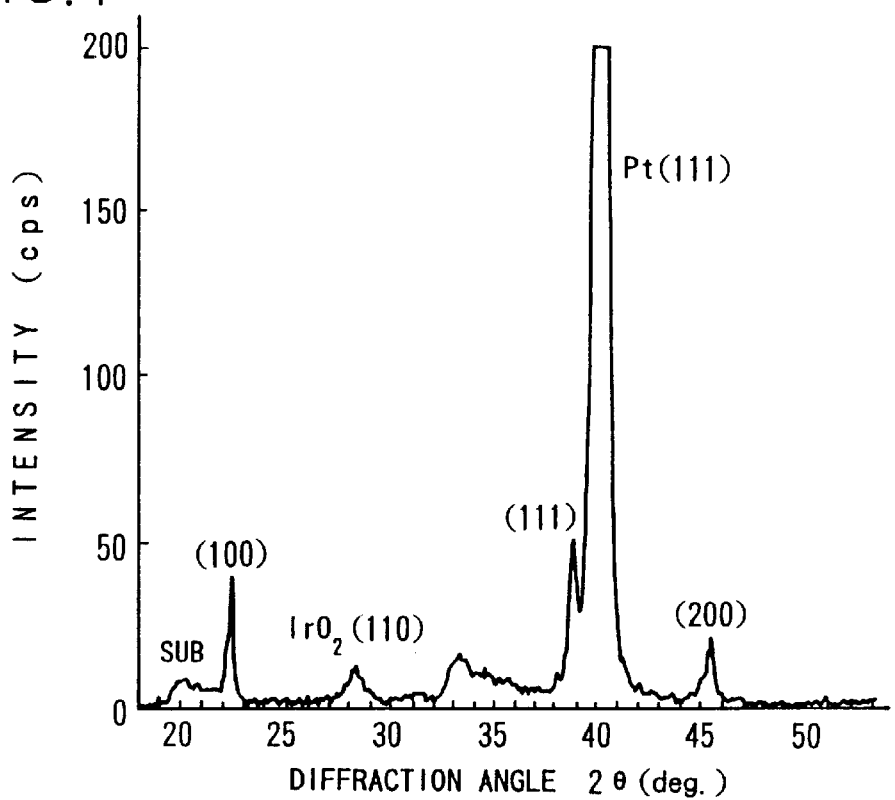
FIG. 7 is a view of a X-ray diffraction pattern of a PZT film containing Ca in Example 7.

Next, this solution was applied in the same manner as in Example 1 by spin coating to the surface of a Pt/IrO$_2$/SiO$_2$/Si substrate, which was then baked to form a PZT film with a thickness of 1,180 angstroms, which film contained Ca. This film was subjected to an X-ray diffraction analysis and as a result an X-ray diffraction pattern shown in FIG. 7 was obtained. It was confirmed that the film had a perovskite structure which was peculiar to the ferroelectrics.

EXAMPLE 8

0.214 mol of lead acetate trihydrate was added to 600 g of 2-methoxyethanol and the mixture was refluxed under heat. The refluxed mixture was concentrated and cooled to room temperature to prepare a solution (A7). While, 0.08 mol of zirconium tetra-n-propoxide, 0.12 mol of titanium tetraisopropoxide, and 0.004 mol of strontium diisopropoxide were added to 340 g of 2-methoxyethanol and the mixture was refluxed under heat, then concentrated, and cooled to room temperature to prepare a solution (B4). After that, the solution (A7) was mixed with the solution (B4) and the mixture was reacted while it was refluxed. The reaction mixture was concentrated and then cooled to room temperature. To the cooled mixture was added a solution consisting of 20 g of acetylacetone, 12.6 g of nitric acid, 5.4 g of water, and 30 g of 2-methoxyethanol. After the resulting mixture was subjected to a hydrolysis reaction at room temperature, the reaction mixture was diluted by 2-methoxyethanol, which was filtered using a 0.22 μm filter to prepare a solution for forming a PZT film which solution contains Sr. The concentration of solution is 10% by weight converted into PZT. Specifically, the same procedures as in Example 7 were carried out except that strontium diisopropoxide was added instead of calcium diisopropoxide in the solution (B3) in Example 7.

In the same manner as in Example 7, even after 30 days passed, neither crystallization nor gelation with time was observed and almost no change in the viscosity of the solution with time was observed. It was hence confirmed that the solution had excellent storage stability.

Figure 8:
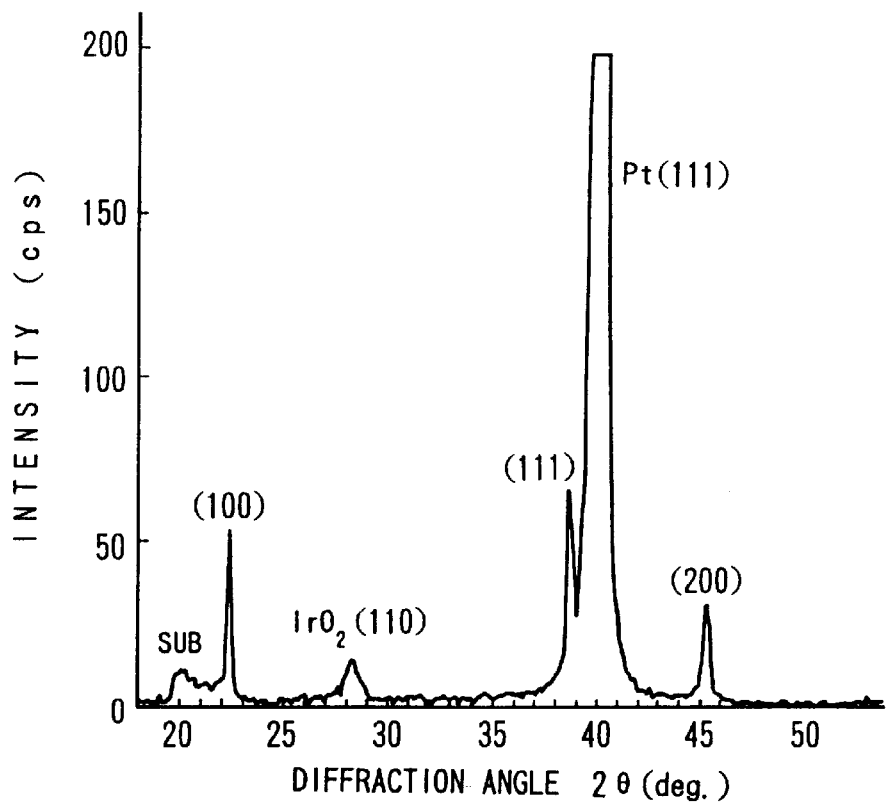
FIG. 8 is a view of a X-ray diffraction pattern of a PZT film containing Sr in Example 8.

Next, this solution was applied in the same manner as in Example 1 by spin coating to the surface of a Pt/IrO$_2$/SiO$_2$/Si substrate, which was then baked to form a PZT film with a thickness of 1,160 angstroms, which film contained Sr. This film was subjected to an X-ray diffraction analysis and as a result an X-ray diffraction pattern shown in FIG. 8 was obtained. It was confirmed that the film had a perovskite structure which was peculiar to the ferroelectrics.

EXAMPLE 9

0.214 mol of lead acetate trihydrate, 0.006 mol of lanthanum acetate 1.5 hydrate, and 0.02 mol of barium acetate were added to 600 g of 2-methoxyethanol and the mixture was refluxed under heat. The refluxed mixture was concentrated and cooled to room temperature to prepare a suspension (A8). While, 0.08 mol of zirconium tetra-n-propoxide and 0.12 mol of titanium tetraisopropoxide were added to 340 g of 2-methoxyethanol and the mixture was refluxed under heat, then concentrated, and cooled to room temperature to prepare a solution (B1). After that, the suspension (A8) was mixed with the solution (B1) and the mixture was reacted while it was refluxed. The reaction mixture was concentrated and then cooled to room temperature. To the cooled mixture was added a solution consisting of 20 g of acetylacetone, 3.15 g of nitric acid, 7.2 g of water, and 50 g of 2-methoxyethanol. After the resulting mixture was subjected to a hydrolysis reaction at room temperature, the reaction mixture was diluted by 2-methoxyethanol, which was filtered using a 0.22 μm filter to prepare a solution for forming a PLZT film which solution contains Ba. The concentration of solution is 10% by weight converted into PLZT. Specifically, the same procedures as in Example 1 were carried out except that barium acetate was added instead of the organic metal compounds of Sr and Ca in the suspension (A1) in Example 1 and the proportions of the components of the solution for adding acetylacetone and nitric acid was altered.

In the same manner as in Example 1, even after 30 days passed, neither crystallization nor gelation with time was observed and almost no change in the viscosity of the solution with time was observed. It was hence confirmed that the solution had excellent storage stability.

Figure 9:
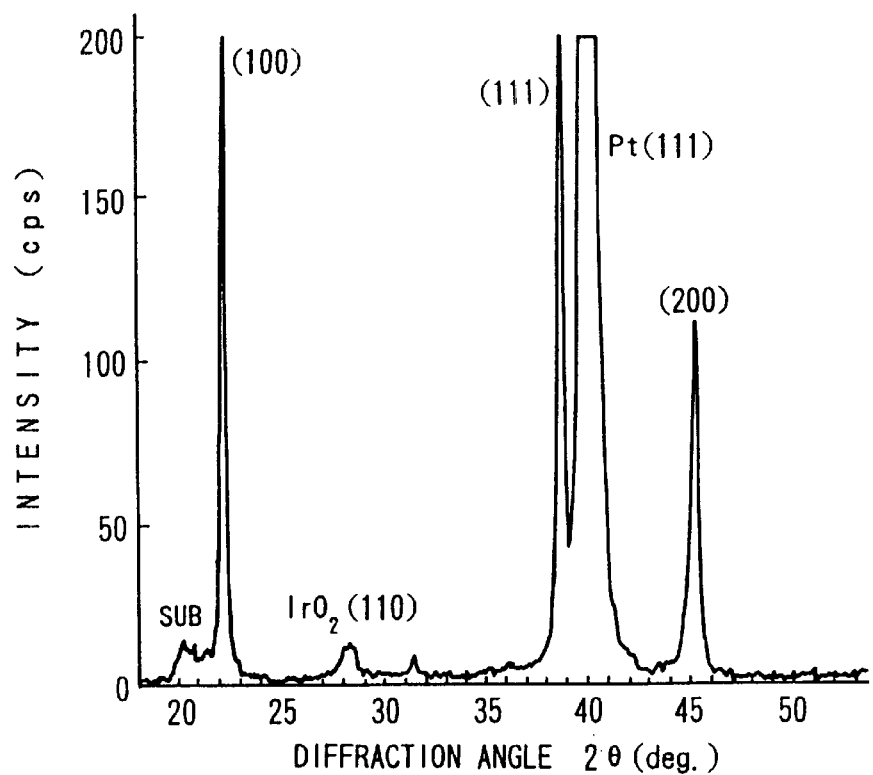
FIG. 9 is a view of a X-ray diffraction pattern of a PLZT film containing Ba in Example 9.

Next, this solution was applied in the same manner as in Example 1 by spin coating to the surface of a Pt/IrO$_2$/SiO$_2$/Si substrate, which was then baked to form a PLZT film with a thickness of 1,350 angstroms, which film contained Ba. This film was subjected to an X-ray diffraction analysis and as a result an X-ray diffraction pattern shown in FIG. 9 was obtained. It was confirmed that the film had a perovskite structure which was peculiar to the ferroelectrics.

EXAMPLE 10

0.214 mol of lead acetate trihydrate and 0.006 mol of lanthanum acetate 1.5 hydrate were added to 600 g of 2-methoxyethanol and the mixture was refluxed under heat. The refluxed mixture was concentrated and cooled to room temperature to prepare a suspension (A9). While, 0.08 mol of zirconium tetra-n-propoxide, 0.12 mol of titanium tetraisopropoxide, and 0.004 mol of magnesium diethoxide were added to 340 g of 2-methoxyethanol and the mixture was refluxed under heat, then concentrated, and cooled to room temperature to prepare a solution (B5). After that, the suspension (A9) was mixed with the solution (B5) and the mixture was reacted while it was refluxed. The reaction mixture was concentrated and then cooled to room temperature. To the cooled mixture was added a solution consisting of 20 g of acetylacetone, 6.3 g of nitric acid, 5.4 g of water, and 30 g of 2-methoxyethanol. After the resulting mixture was subjected to a hydrolysis reaction at room temperature, the reaction mixture was diluted by 2-methoxyethanol, which was filtered using a 0.22 μm filter to prepare a solution for forming a PLZT film which solution contains Mg. The concentration of solution is 10% by weight converted into PLZT. Specifically, the same procedures as in Example 2 were carried out except that the amount of 2-methoxyethanol in the suspension (A2) in Example 2 was altered, magnesium ethoxide was used instead of the organic metal compounds of Ca and Sr which were additives for the solution (B2), and the proportions of the components of the additive solution for adding acetylacetone and nitric acid were altered.

In the same manner as in Example 2, even after 30 days passed, neither crystallization nor gelation with time was observed and almost no change in the viscosity of the solution with time was observed. It was hence confirmed that the solution had excellent storage stability.

Figure 10:
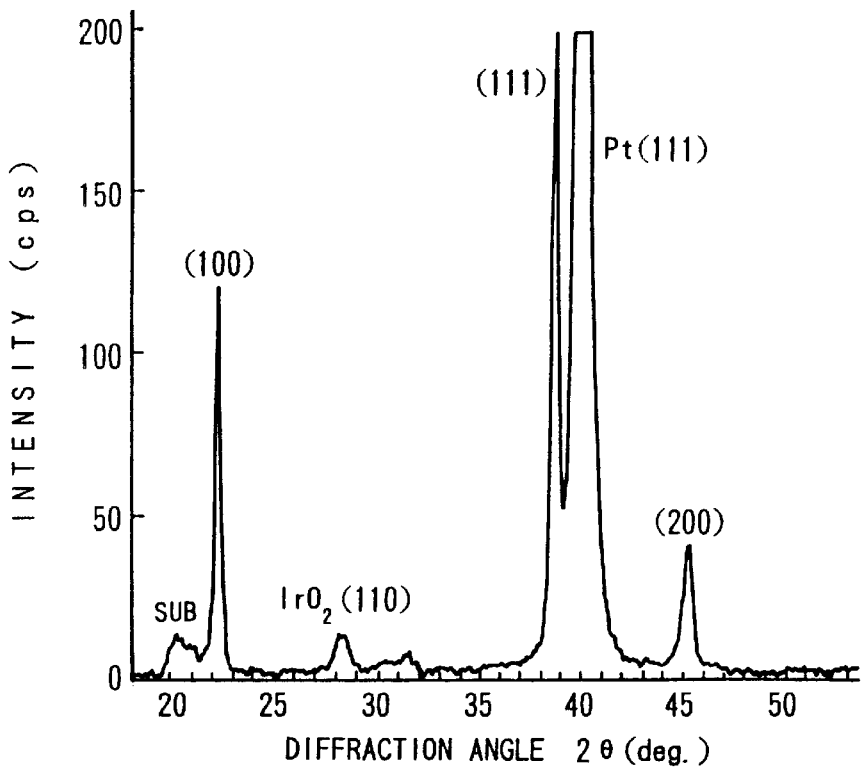
FIG. 10 is a view of a X-ray diffraction pattern of a PLZT film containing Mg in Example 10.

Next, this solution was applied in the same manner as in Example 1 by spin coating to the surface of a Pt/IrO$_2$/SiO$_2$/Si substrate, which was then baked to form a PLZT film with a thickness of 1,190 angstroms, which film contained Mg. This film was subjected to an X-ray diffraction analysis and as a result an X-ray diffraction pattern shown in FIG. 10 was obtained. It was confirmed that the film had a perovskite structure which was peculiar to the ferroelectrics.

EXAMPLE 11

0.214 mol of lead acetate trihydrate was added to 600 g of 2-methoxyethanol and the mixture was refluxed under heat. The refluxed mixture was concentrated and cooled to room temperature to prepare a solution (A7). While, 0.08 mol of zirconium tetra-n-propoxide, 0.12 mol of titanium tetraisopropoxide, and 0.004 mol of magnesium diethoxide were added to 340 g of 2-methoxyethanol and the mixture was refluxed under heat, then concentrated, and cooled to room temperature to prepare a solution (B6). After that, the solution (A7) was mixed with the solution (B6) and the mixture was reacted while it was refluxed. The reaction mixture was concentrated and then cooled to room temperature. To the cooled mixture was added a solution consisting of 20 g of acetylacetone, 6.3 g of nitric acid, 5.4 g of water, and 30 g of 2-methoxyethanol. After the resulting mixture was subjected to a hydrolysis reaction at room temperature, the reaction mixture was diluted by 2-methoxyethanol, which was filtered using a 0.22 μm filter to prepare a solution for forming a PZT film which solution contains Mg. The concentration of solution is 10% by weight converted into PZT. Specifically, the same procedures as in Example 7 were carried out except that magnesium diethoxide was added instead of calcium propoxide in the solution (B3) in Example 7 and the amount of nitric acid was altered.

In the same manner as in Example 7, even after 30 days passed, neither crystallization nor gelation with time was observed and almost no change in the viscosity of the solution with time was observed. It was hence confirmed that the solution had excellent storage stability.

Figure 11:
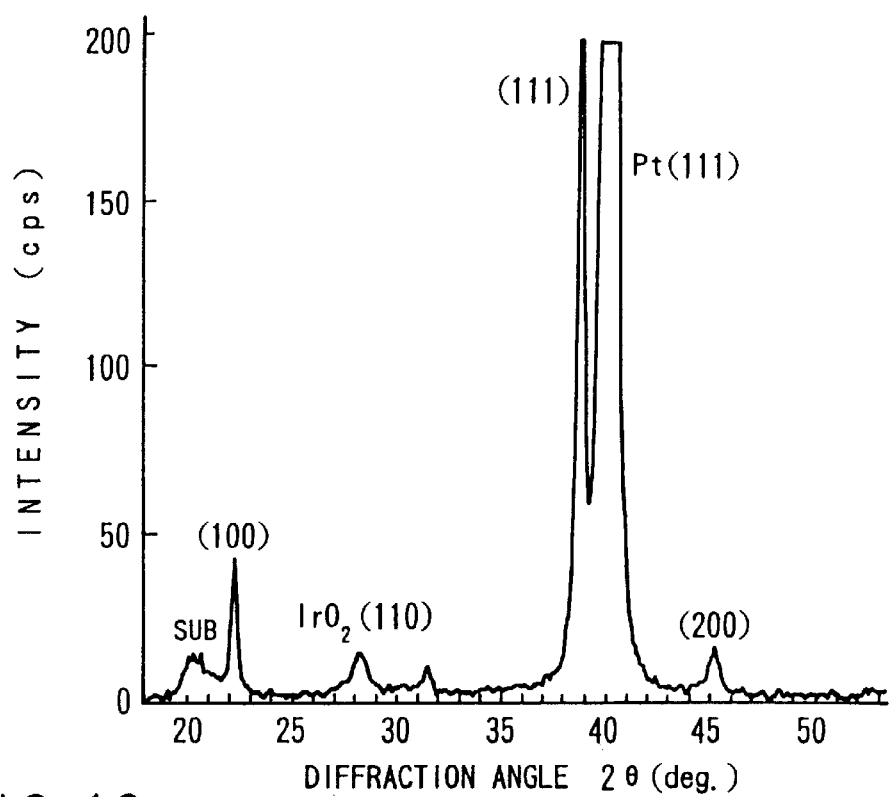
FIG. 11 is a view of a X-ray diffraction pattern of a PZT film containing Mg in Example 11.

Next, this solution was applied in the same manner as in Example 1 by spin coating to the surface of a Pt/IrO$_2$/SiO$_2$/Si substrate, which was then baked to form a PZT film with a thickness of 1,340 angstroms, which film contained Mg. This film was subjected to an X-ray diffraction analysis and as a result an X-ray diffraction pattern shown in FIG. 11 was obtained. It was confirmed that the film had a perovskite structure which was peculiar to the ferroelectrics.

EXAMPLE 12

0.214 mol of lead acetate trihydrate and 0.002 mol of barium acetate were added to 600 g of 2-methoxyethanol and the mixture was refluxed under heat. The refluxed mixture was concentrated and cooled to room temperature to prepare a suspension (A10). While, 0.08 mol of zirconium tetra-n-propoxide, 0.12 mol of titanium tetraisopropoxide, and 0.004 mol of strontium isopropoxide were added to 340 g of 2-methoxyethanol and the mixture was refluxed under heat, then concentrated, and cooled to room temperature to prepare a solution (B4). After that, the suspension (A10) was mixed with the solution (B4) and the mixture was reacted while it was refluxed. The reaction mixture was concentrated and then cooled to room temperature. To the cooled mixture was added a solution consisting of 20 g of acetylacetone, 6.3 g of nitric acid, 7.2 g of water, and 50 g of 2-methoxyethanol. After the resulting mixture was subjected to a hydrolysis reaction at room temperature, the reaction mixture was diluted by 2-methoxyethanol, which was filtered using a 0.22 μm filter to prepare a solution for forming a PZT film which solution contains Ba and Sr. The concentration of solution is 10% by weight converted into, PZT. Specifically, the same procedures as in Example 8 were carried out except that barium acetate was added to the solution (A7) in Example 8 and the proportions of the components of the solution for adding acetylacetone and nitric acid were altered.

In the same manner as in Example 8, even after 30 days passed, neither crystallization nor gelation with time was observed and almost no change in the viscosity of the solution with time was observed. It was hence confirmed that the solution had excellent storage stability.

Figure 12:
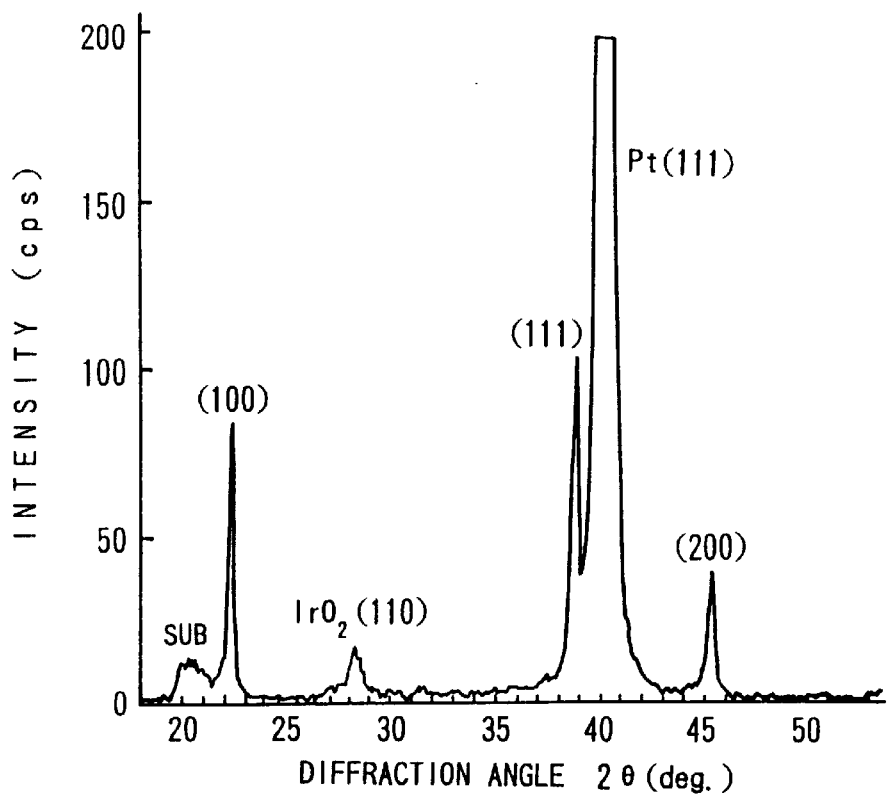
FIG. 12 is a view of a X-ray diffraction pattern of a PZT film containing Ba and Sr in Example 12.

Next, this solution was applied in the same manner as in Example 1 by spin coating to the surface of a Pt/IrO$_2$/SiO$_2$/Si substrate, which was then baked to form a PZT film with a thickness of 910 angstroms, which film contained Ba and Sr. This film was subjected to an X-ray diffraction analysis and as a result an X-ray diffraction pattern shown in FIG. 12 was obtained. It was confirmed that the film had a perovskite structure which was peculiar to the ferroelectrics.

According to the present invention, a solution containing acetylacetone and nitric acid is mixed with a solution containing organic metal compounds of elements constituting the ferroelectrics. Neither crystallization nor gelation of the solution was therefore caused thereby producing a qualitatively stable solution for forming ferroelectric film. As a consequence, this solution is applied to a substrate to produce a ferroelectric film having excellent ferroelectric properties and can be therefore used for semiconductor memories.

Although preferred example have been described in some detail, it is to be understood that certain changes can be made by those skilled in the art without departing from the spirit and scope of the invention as defined by the appended claims.

What is claimed is:

1. A method for forming a ferroelectric film comprising:
   (a) preparing a solution comprising at least one organic solvent and at least one organic metal compound wherein said at least one organic metal compound has metals constituting one ferroelectric, said metals containing at least one group II element;
   (b) preparing a ferroelectric film formation solution by mixing acetylacetone and an aqueous nitric acid solution with said solution;
   (c) applying said ferroelectric film formation solution to a surface of a substrate;
   (d) drying said applied ferroelectric film formation solution; and
   (e) baking said ferroelectric film formation solution after it is dried.

2. A method for forming a ferroelectric film according to claim 1, wherein said ferroelectric film formation solution contains an organic metal compound of a II group element in the periodic table to form a ferroelectric film containing said II group element in the periodic table.

3. A method for forming a ferroelectric film according to claim 1, wherein said metals comprise titanium, zirconium, lead, and group II element, which constitute lead zirconate titanate (PZT).

4. A method for forming a ferroelectric film according to claim 1, wherein said metals comprise titanium, zirconium, lanthanum, lead, and group II element, which constitute lead lanthanum zirconate titanate (PLZT).

* * * * *